(12) United States Patent
Bahl et al.

(10) Patent No.: US 6,583,044 B2
(45) Date of Patent: Jun. 24, 2003

(54) BURIED CHANNEL IN A SUBSTRATE AND METHOD OF MAKING SAME

(75) Inventors: Sandeep Bahl, Palo Alto, CA (US); Karen L. Seaward, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/892,920

(22) Filed: Jun. 26, 2001

(65) Prior Publication Data

US 2002/0197802 A1 Dec. 26, 2002

(51) Int. Cl.[7] ................. H01L 21/4763; H01L 21/336; H01L 29/74
(52) U.S. Cl. .............. 438/619; 438/282; 438/424; 438/228; 438/449; 257/141; 257/222; 257/66; 257/194; 257/223
(58) Field of Search ................. 438/619, 228, 438/79, 449, 424, 147, 144, 257, 31, 305, 172, 82, 347, 782, 587, 151, 282; 257/141, 222, 66, 194, 223

(56) References Cited

U.S. PATENT DOCUMENTS

| 5,932,315 A | 8/1999 | Lum et al. ............ 428/172 |
| 5,992,769 A | 11/1999 | Wise et al. ........... 239/548 |
| 6,031,286 A | 2/2000 | Levine et al. ......... 257/714 |
| 6,093,330 A | * 7/2000 | Chong et al. .......... 216/2 |

OTHER PUBLICATIONS

Article entitled "Localized GaAs Etching with Acidic Hydrogen peroxide Solutions," dated Apr. 1981, vol. 128, No. 4 of the Journal of Electrochemical Society, (8 pages).

* cited by examiner

Primary Examiner—Matthew Smith
Assistant Examiner—Igwe U. Anya

(57) ABSTRACT

A buried channel and a method of fabricating a buried channel in a substrate including depositing a layer of masking material onto a surface of a substrate, etching a groove in the masking layer, etching a channel into the substrate through the groove, and depositing a cover layer over the masking layer and groove such that the covering layer at least substantially closes over the groove.

20 Claims, 2 Drawing Sheets

BURIED CHANNEL IN A SUBSTRATE AND METHOD OF MAKING SAME

BACKGROUND OF THE INVENTION

1. Field of the Invention

The present invention relates generally to micro-machining, and more particularly, but not by way of limitation, to a buried channel in a substrate and a low temperature, low-cost method of fabricating the same.

2. Description of the Related Art

Many different technologies have benefited from advances in micro-machining, and as micro-machining becomes less expensive and more commonplace, more applications will come about. One common structural feature in a device made by micro-machining is a buried channel. Buried channels are used throughout the electrical, chemical, and biochemical fields, for instance in microfluidic and gas applications. In many instances it is desirable that the buried channel be monolithically integrated with other devices, such as electronics, sensors, and micro plumbing, for example micro-machined valves and pumps. Also, in many applications the device incorporating the buried channel is better suited for its application if it is a consumable. Thus, efforts are taken to minimize the overall cost of fabricating the device, and using low-cost methods of fabricating its features, such as a buried channel, help minimize the cost.

Most methods for fabricating buried channels require many steps, and thus are not low-cost. Those that are low-cost may not be suited for monolithic integration with other devices. One low-cost method for fabricating a buried channel is described in U.S. Pat. No. 6,031,286 by Levine et al. This method involves depositing a film into an open trench. The film lines the sidewalls and bottom of the trench, and builds up covering over the top. With this method it is necessary that the trench have a depth that is much greater than its width, for example a 2:1 aspect ratio, so that the filler material will close off the trench. However, it is difficult to control the shape of the resulting buried channel, and fabricating a buried channel with this method may result in a channel that is not an optimum shape. Also, this method requires a substantial thickness in the layer of material covering the trench, and thus the method is limited by the ultimate attainable thickness of the covering material.

Therefore, there remains a continued need for a method of fabricating a buried channel that is low-cost. It is desirable that the method enable fabrication of large channels, maximizing the channel size attainable for a given thickness of material. It is also desirable that the method be suitable for low temperature fabrication techniques to enable the use of a broader range of materials, including inexpensive polymers. Further, the method should allow monolithic integration of the buried channel with other devices.

SUMMARY OF THE INVENTION

The invention is a low-cost method of fabricating a buried channel in a substrate. The method includes depositing a layer of masking material onto the surface of a substrate. A groove is etched through the masking material to expose the substrate. A channel is etched into the substrate through the groove. A covering layer is deposited over the masking layer and groove such that the covering layer, at least substantially, covers over the groove.

Etching a channel can comprise using an isotropic etchant to etch an undercut into the substrate beneath the masking layer. Etching can comprise etching with an anisotropic etchant chosen to etch primarily downward into the substrate, and etching with an isotropic etchant to etch undercuts beneath the masking layer. Etching with an anisotropic etchant can be performed before the step of etching with an isotropic etchant. Etching of a channel can further comprise etching with an anisotropic etchant chosen to etch primarily along a crystal plane of the substrate which is not perpendicular to the surface of the substrate. The cover layer can be deposited such that the layer is conformal so that a portion of the cover layer material deposits in the channel and forms a passivating layer in the channel. The groove can further be etched with sidewalls which slope inward and downward. The method can further comprise applying a second cover layer over the first cover layer and groove to completely close off the groove. The second cover layer can be spun-on. Depositing the cover layer can further comprise controlling the thickness of the cover layer to leave an opening of a pre-determined width above the groove to create a sieve. The method can further comprise etching a portion of the cover layer over the groove to create an opening of a pre-determined width to create a sieve. The method can also comprise etching a portion of the cover layer into the channel to create a via. Etching a groove can further comprise etching the groove up to a point of access of a monolithically integrated device. The method can further include etching an access point for a monolithically integrated device through the cover layer and into the channel.

The method of the invention can utilize low temperature processing techniques in fabricating the buried channel, and also allows monolithically integrating the channel with other devices. The method of invention enables fabrication of larger buried channels than would otherwise be possible with a given covering material thickness The invention is also drawn to a buried channel in a substrate. The substrate includes a channel open to the surface of the substrate. A first layer is located on the surface of the substrate and over the channel. The first layer has a groove therein that follows at least a portion of the channel. A second layer is located on top of the first layer and at least substantially covers over the groove.

BRIEF DESCRIPTION OF THE DRAWINGS

Various objects and advantages of this invention will become apparent and more readily appreciated from the following description of the presently preferred exemplary embodiments and methods, taken in conjunction with the accompanying drawings of which.

DETAILED DESCRIPTION OF THE EXEMPLARY EMBODIMENTS OF THE INVENTION

Exemplary embodiments of the invention will now be described more fully with reference to the accompanying drawings. This invention may, however, be embodied in many different forms and should not be construed as limited to the embodiments and preferred methods set forth herein.

Figure 1A:
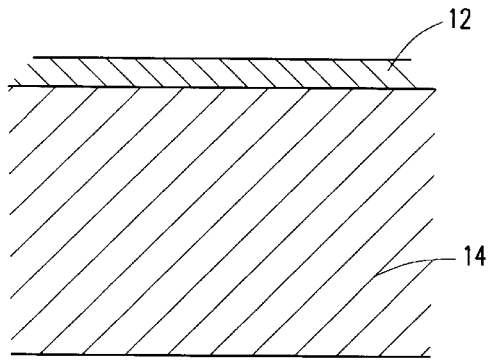
FIGS. 1A–D are side elevational cross-section views depicting the fabrication of a buried channel in accordance with the teachings of this invention.

FIGS. 1A–D depict a buried channel 10 and a process for fabricating the buried channel 10 in accordance with the teachings of this invention. Referring first to FIG. 1A, a first film 12 of a masking material is deposited on a substrate 14. The substrate can be various materials, for example, but in no means by limitation, semiconductor substrate materials such as silicon, gallium arsenide, and indium phosphide, or plastic materials such as polyimide (for example KAPTON a registered trademark of E. I du Pont de Nemours, Inc.) or polyaryletherketone (for example PEEK a trademark of Victrex, Inc.). Semiconductor substrate materials are particularly well suited for integration with electronic or optical devices, and when using crystallographic etches as is described in more detail below. Polymer substrates are preferable when low cost is a priority.

The film 12 is preferably inert to the chemicals or compositions that may ultimately flow in the completed buried channel 10, because the channel 10 contents may contact the film 12. The material for the film 12 could be, for example but in no means by limitation, silicon dioxide, silicon nitride, and silicon oxynitride; however, one of ordinary skill in the art will appreciate the applicability of other film materials, including organic film materials, and preferably those film materials that can be deposited to be conformal and those that are inert to the channel 10 contents. Also, film materials that can be deposited at lower temperatures than silicon dioxide and silicon nitride may be preferable, because they enable the use of those polymer substrate materials that could be damaged by the temperatures needed to deposit these films. The deposition technique may vary depending on the masking material chosen, but virtually any deposition method known in the art is acceptable. For example, but in no means by limitation, the film 12 can be deposited on the substrate 14 using chemical vapor deposition (CVD), plasma enhanced CVD (PECVD), or sputter deposition.

Figure 1B:
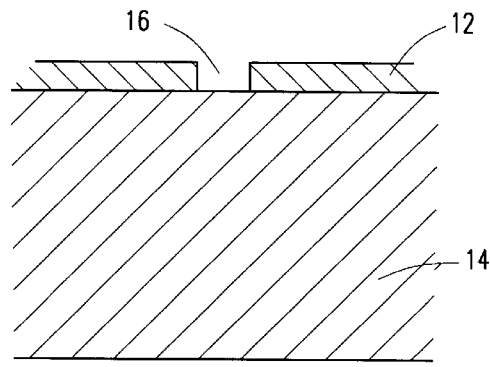

Referring to FIG. 1B, a groove 16 is formed in the masking film 12. The groove will be used in fabricating the completed channel 10, and thus is placed in the intended path of the channel 10. The groove 16 can be formed using photolithography and etching techniques, in which a photoresist is coated over the first film 12 and developed in the pattern of the groove 16. Then, groove 16 is etched chemically, by laser, or otherwise into the film 12, and the photoresist is removed. It is preferred that a selective etch is used that primarily etches the masking film 12. The width of the groove 16 is related to the width of the desired buried channel 10: the wider the groove 16, the wider the channel 10. However, the groove 16 is preferably narrower than the width of channel 10.

Figure 1C:
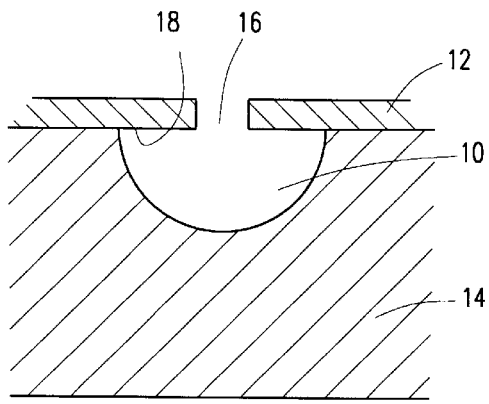

Upon completion of groove 16, the substrate 14 is then etched to form channel 10. The first film 12 masks the substrate 14 in the etching process. Depending on the size and shape of the buried channel 10 desired, different etchants can be used. An isotropic etchant, that etches the substrate at substantially the same rate in all directions, will etch undercut areas 18 under the masking material, as seen in FIG. 1C. This provides a channel 10 of approximately equal depth and width. To increase the width or depth of the channel 10 an anisotropic etchant can be used.

Figure 2:
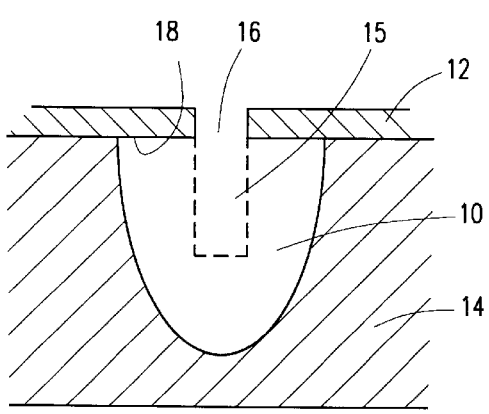
FIG. 2 is a side elevational cross-section view of a channel formed using both an isotropic and an anisotropic etchant in accordance with the teachings of this invention.

Referring to FIG. 2, an anisotropic etching process, for example an anisotropic etchant or reactive ion etching, chosen to etch more deeply into the substrate 14 than an isotropic etchant, can be used prior to the isotropic etchant to increase the depth of the channel 10. The anisotropic etch first etches a deep narrow channel 15, then the isotropic etchant is applied into the deep narrow channel 15. The resultant channel 10 has undercut areas 18 of substantially the same size as the channel in FIG. 1C, but is formed notably deeper into the substrate 14.

Figure 3:
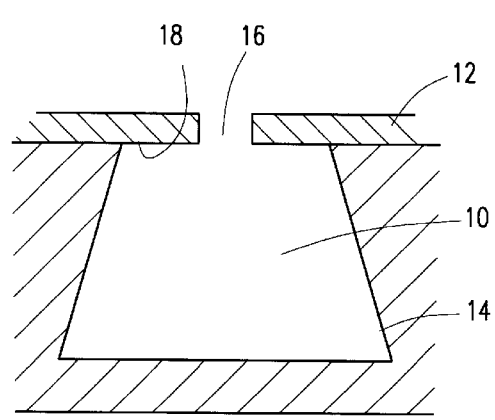
FIG. 3 is a side elevational cross-section view of a dovetail profile channel formed in accordance with the teachings of this invention.

Alternately, anisotropic etchants that etch preferentially along certain crystal planes, for example crystallographic etchants, can be used to etch different shaped channels 10. Depending on how substrate 14 is oriented, a given crystal plane within the substrate material may not be perpendicular to the surface of the substrate 14. Choosing an etchant that will etch along a plane not perpendicular to the surface of the substrate 14 may enable fabrication of channels that slope outward from the undercut areas 18. For example, but in no means by limitation, use of a $HCl:H_2O_2:H_2O=1:1:9$ solution to etch a GaAs substrate could result in a dovetail profile as shown in FIG. 3. Such a dovetail profile enables formation of a wider channel 10 than is possible with an isotropic etchant, because the width of a channel 10 formed with an isotropic etchant is limited to the size of the undercut areas 18 the isotropic etchant will form. V-shaped profiles are also achievable by using anisotropic etchants.

Figure 1D:
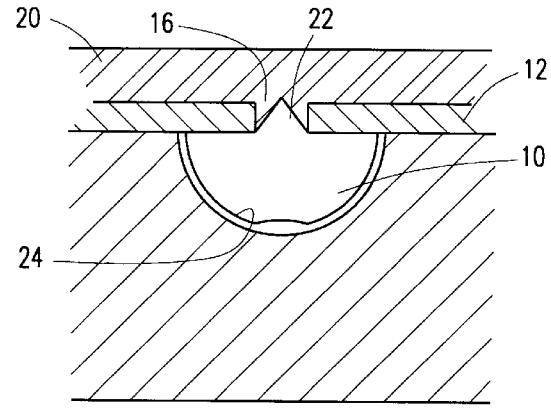

Referring to FIG. 1D, a second film layer 20 may be deposited over the first film layer 12 and groove 16. As the second film 20 is built up, the groove 12 closes off and seals over the channel 10, thus creating the buried channel 10. If the second film 20 is conformal, some of the material will deposit in the channel 10. A conformal film is a film that, when deposited, will deposit to some extent on all exposed surfaces. Thus, depositing a conformal film such that some of the material deposits in the channel 10, forms a protective film layer 24 in the channel 10, and passivates the channel 10 from its contents.

The second film layer 20 can be formed by depositing material, for example, silicon dioxide, silicon nitride, silicon oxynitride or other material, over the first film 12 and groove 16 until the groove 16 is completely closed off Virtually any depositing method known in the art can be used, for example, but in no means by limitation, a chemical vapor deposition (CVD), plasma enhanced CVD, or sputter deposition. The wider the groove 16, the greater the thickness of the film that must be deposited to close off the groove 16.

Figure 4:
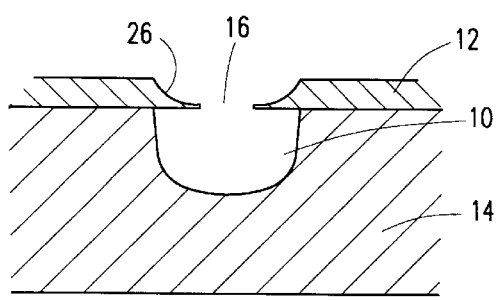
FIG. 4 is a side elevational cross-section view depicting a masking film having sloped sidewalls in accordance with the teachings of this invention.

It should be noted that a small notch 22 forms in groove 16 as it fills over. This notch 22 can be minimized by providing the groove 16 with sloped sidewalls 26, such as seen in FIG. 4, that slope inward and downward towards channel 10. While FIG. 4 depicts sidewalls in which the slope is curved, as would result from using an isotropic etchant to create the sloped sidewalls 26, it is also within the scope of this invention to provide the sidewalls 26 with straight, rather than curved surfaces. Straight sloped sidewalls 26 can be produced, for example, by using a masking material that is also etched while etching the groove 16 in the first film layer 12. Thus, the masking material gradually exposes more area of first film layer 12 to the etching process. As more area is exposed, more of the first film layer 12 is etched. This tends to form sidewalls 26 that slope substantially straight, inward and downward toward channel 10.

Figure 5:
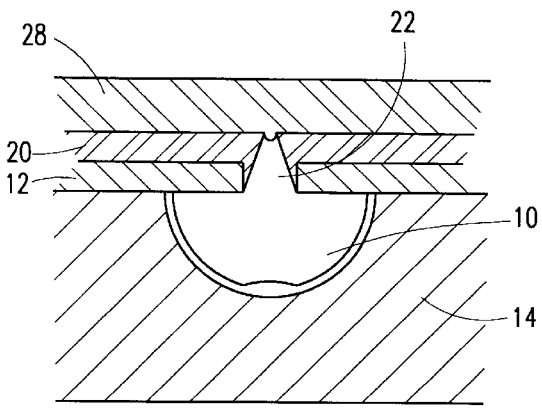
FIG. 5 is a side elevational cross-section view depicting a second and third layers formed in accordance with the teachings of this invention.

Alternatively, as depicted in FIG. 5, the second film layer 20 can be deposited until the groove 16 is substantially, though not necessarily completely, closed off and then a third layer 28 of a spin-on film, for example polyimide or benzocyclobutane, or a spin-on glass can be applied over the second film layer 20 to completely close off the groove 16. Some portion of the third layer 28 may collect in the notch 22, thus reducing its size.

It is important to note that the methods described herein allow construction of a wider buried channel 10 than other low cost methods. The width of a channel is limited by the maximum distance the covering film layer can span, which in turn is function of the strength and the thickness of the film layer. In the present embodiments, the groove 16 over which the second film layer 20 is formed is narrower than the width of the channel 10. Thus, for a given film strength and a given film thickness, the resulting channel 10 can be wider than channels fabricated by other methods.

Figure 6:
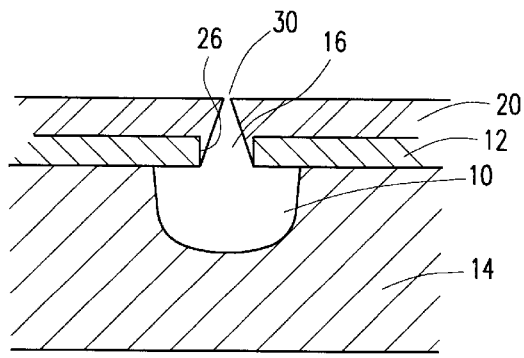
FIG. 6 is a side elevational cross-section view depicting a second layer with an opening formed in accordance with the teachings of this invention.

As seen in FIG. 6, the thickness of the second film layer 20 can be adjusted to leave an opening 30 of predetermined dimension. This opening 30 can act as a sieve preventing particles larger than the opening from entering the channel 10 while allowing particles smaller than the opening to enter the channel. The particle size filtered is dependent on the thickness of the deposited second film layer 20 and the resultant size of the opening 30; however, submicron filtration is possible. It is also possible to control the length of the opening 30 by controlling the depth of the second film layer 20 at different points along the channel 10, thus allowing the opening 30 to close over in areas where filtration is not needed. However, in many applications, the length of opening 30 need not be closely controlled.

Opening 30 can also be formed by etching a portion of the second film 20 to uncover a section of notch 22. Again, opening 30 can act as a sieve as described above. The depth of the etch is controlled, for example, by using laser reflectometry or any other method known in the art to control the width of the resultant opening 30, and thus the particle size filtered. Also, masking and patterning techniques known in the art can be employed to control what portions of the second film layer 20 are etched. Either method, controlling the second film 20 thickness or etching the second film 20, provides a convenient, inexpensive method of providing a filtration mechanism. Such inexpensive filtration mechanisms are especially useful in low-cost consumable applications where reliability due to clogging is not an issue.

Figure 7:
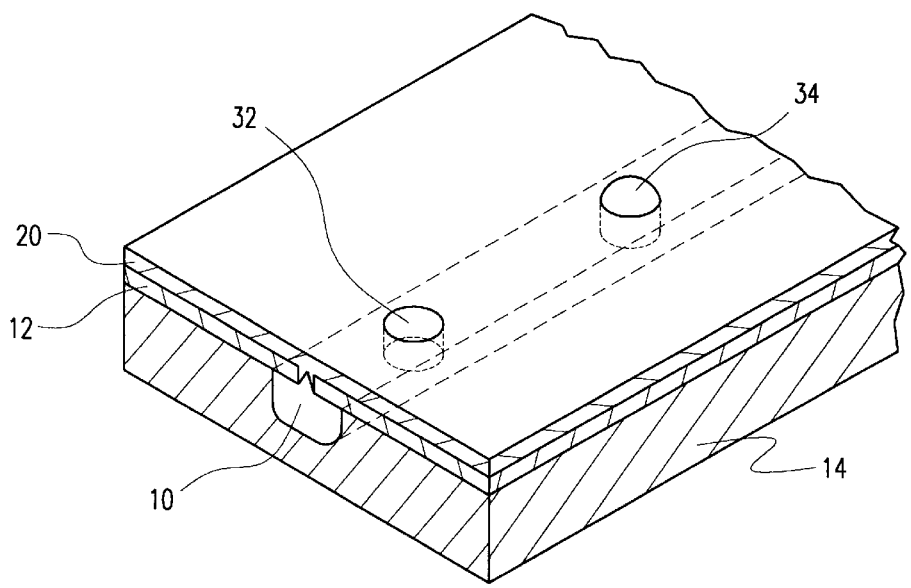
FIG. 7 is a perspective view of a substrate having a via and a monolithically integrated device in accordance with the teachings of this invention.

Referring to FIG. 7, a via 32 can be constructed to communicate with the buried channel 10. The via 32 can be etched through the layers over channel 10 to allow access into the channel 10. Alternately, via 32 can be etched through the substrate 14 into the channel 10. The via 32 can be larger, smaller or of the same width as channel 10. Masking and patterning, for example, but in no means by limitation, using photoresist and lithography techniques, can be used to define the placement of via 32 before etching.

A monolithically integrated device 34, such as a sensor, valve, gear, or other device, can be incorporated with channel 10 by constructing the channel 10 at the point of communication with the device 34. For example, with monolithically integrated device 34 in position, groove 16 can be etched to the point of communication, then the channel 10 etched to the point of communication. Alternatively, the channel 10 can be constructed to the expected point of communication, and the device 34 installed or fabricated after the channel 10 has been constructed. As with the via 32, the device 34 can be larger, smaller or the same size as the channel 10.

The method of the present invention has many significant advantages. It provides a low-cost process for fabricating a buried channel in a substrate. The process can utilize a wide range of film materials, many of which can be formed at low temperatures. This enables using inexpensive polymer materials that would be damaged by higher temperature deposition techniques, further reducing the cost of the completed part. The process allows ready integration of the buried channels with other monolithically integrated devices. Also, the method utilizes common semiconductor processing tools and processes. Larger channels can be fabricated than with other low-cost methods. Finally, the covering layers can be configured to act as a particulate sieve.

It is thus believed that the performance of the present invention will be apparent from the foregoing description of the preferred exemplary method. It will be obvious to a person of ordinary skill in the art that various changes and modifications may be made herein without departing from the invention defined by the following claims.

We claim:

1. A method of fabricating a buried channel in a substrate, the method comprising:

depositing a layer of a masking material onto a surface of the substrate;

etching a groove through the masking layer to expose the substrate, the groove comprising sloped sidewalls that slope inward and downward;

etching a channel into the substrate through the groove; and depositing a cover layer over the masking layer and groove such that the covering layer at least substantially covers over the groove, the sloped sidewalls operating to minimize a notch formed within the groove and proximate to the channel.

2. The method of claim 1 wherein etching the channel comprises using an isotropic etchant to etch an undercut into the substrate beneath the masking layer.

3. The method of claim 1 wherein etching the channel comprises etching with an anisotropic etching technique chosen to etch primarily downward into the substrate, and etching with an isotropic etchant to etch undercuts beneath the masking layer.

4. The method of claim 3 wherein etching with an anisotropic etchant is performed before the step of etching with an isotropic etchant.

5. The method of claim 1 wherein etching the channel further comprises etching with an anisotropic etchant chosen to etch primarily along a crystal plane of the substrate.

6. The method of claim 1 wherein depositing the cover layer comprises depositing the cover layer such that the cover layer is conformal such that a portion of the cover layer material deposits in the channel.

7. The method of claim 1 further comprising applying the second cover layer over the first cover layer and groove to completely close off the groove.

8. The method of claim 7 wherein the second cover layer is applied using a spin-on technique.

9. The method of claim 1 wherein the step of depositing the cover layer comprises controlling the thickness of the cover layer such that an opening having a pre-determined dimension is established above the channel.

10. The method of claim 1 further comprising etching a portion of the cover layer over the groove to produce an opening having a pre-determined dimension.

11. The method of claim 1 further comprising the step of etching a portion of the cover layer into the channel thereby creating a via extending through the cover layer to said channel.

12. The method of claim 1 wherein etching a groove comprises etching the groove up to a point of intended access by a monolithically integrated device.

13. The method of claim 1 further comprising etching an access point through the cover layer and into the channel, the access point adapted to provide a monolithically integrated device access to the channel.

14. The method of claim 1 wherein the groove is narrower than the channel.

15. A buried channel, comprising:

a substrate;

a channel in the substrate, the channel comprising an upper portion that is open to a surface of the substrate;

a first layer on the surface of the substrate over the channel, the first layer comprising a groove therein above at least a portion of the channel, the groove having sloped sidewalls that slope inward and downward toward the channel; and a second layer on the first layer, the second layer at least substantially covering the groove, the sloped sidewalls operating to minimize a notch formed within the groove and proximate to the channel.

16. The buried channel of claim 15, further comprising a third layer on top of the second layer, the third layer completely covering over the groove.

17. The buried channel of claim 15, wherein the second layer includes a gap having a pre-determined width, the gap being above at least a portion of the channel.

18. The buried channel of claim 15 wherein the depth of the channel is greater than a width of the channel.

19. The buried channel of claim 15 wherein the channel is etched along a crystal plane of the substrate.

20. The buried channel of claim 15 wherein the second layer is also on a surface of the channel.

* * * * *